(12) United States Patent
Miyagawa

(10) Patent No.: US 7,863,525 B2
(45) Date of Patent: Jan. 4, 2011

(54) PRINTED CIRCUIT BOARD AND ELECTRONIC DEVICE

(75) Inventor: Shigenori Miyagawa, Ome (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 12/404,213

(22) Filed: Mar. 13, 2009

(65) Prior Publication Data

US 2010/0053921 A1     Mar. 4, 2010

(30) Foreign Application Priority Data

Mar. 18, 2008    (JP) ............................... 2008-070050

(51) Int. Cl.
*H05K 1/16*     (2006.01)
*H05K 1/11*     (2006.01)
*H01R 12/04*    (2006.01)

(52) U.S. Cl. ..................... 174/260; 174/262; 361/792

(58) Field of Classification Search ............ 174/260, 174/262–266; 361/783, 792–795
See application file for complete search history.

(56) References Cited

U.S. PATENT DOCUMENTS 5,784,262 A * 7/1998 Sherman .................. 361/777

6,587,353 B2   7/2003 Sumikawa et al.

FOREIGN PATENT DOCUMENTS

| JP | 07-321247 | 12/1995 |
| JP | 11-220247 | 8/1999 |
| JP | 2000-261110 | 9/2000 |
| JP | 2001-068594 | 3/2001 |
| JP | 2001-168511 | 6/2001 |
| JP | 2001-332653 | 11/2001 |
| JP | 2005-108993 | 4/2005 |
| JP | 2006-114777 | 4/2006 |

* cited by examiner

*Primary Examiner*—Jeremy C Norris
(74) *Attorney, Agent, or Firm*—Blakely, Sokoloff, Taylor & Zafman LLP

(57) ABSTRACT

According to one embodiment, there is provided a printed circuit board including a plurality of electrode pads provided on a component mounting face on which a semiconductor component is to be mounted, a plurality of hole terminals provided on the component mounting face so as to correspond to the electrode pads, and a plurality of wiring pattern layers connecting the plurality of electrode pads and the plurality of hole terminals corresponding to the plurality of electrode pads, the plurality of wiring pattern layers being wired across directions of elastic deformation of the component mounting face.

7 Claims, 4 Drawing Sheets

PRINTED CIRCUIT BOARD AND ELECTRONIC DEVICE

CROSS-REFERENCE TO RELATED APPLICATIONS

This application is based upon and claims the benefit of priority from Japanese Patent Application No. 2008-070050, filed Mar. 18, 2008, the entire contents of which are incorporated herein by reference.

BACKGROUND

1. Field

One embodiment of the invention relates to a printed circuit board for mounting a semiconductor component thereon, and an electronic device.

2. Description of the Related Art

Recently, memory chips for use as semiconductor components have been highly developed in terms of density and capacity and have been provided in the form of, for example, a ball grid array (BGA) package. Further development of the structures of the packaged memories continues to strive to fulfill the requirement for making a silicon chip that has, on the one hand, a larger memory chip, and a more compact package on the other hand. Therefore, the BGA package incorporating such a memory chip suffers more from heat stress in that expansion of the silicon chip due to temperature increases when operating and contraction when not operating are repeated. Such a silicon chip is connected to a substrate by bonding wire or the like and is connected to an external joining electrode that has solder balls provided on the underside of the substrate.

The printed circuit board on which a semiconductor package like the foregoing BGA is mounted requires a highly reliable, stable pattern formation (i.e., circuit formation) to be maintained despite elastic deformation (i.e., expansion and contraction) of the wiring board face when subjected to such heat stress as described above.

A technology for forming a pattern on a printed circuit board for mounting such a semiconductor package has been proposed in Jpn. Pat. Appln. KOKAI Publication No. 2000-261110, in which at least the main parts of leader lines formed on the substrate surface (i.e., surface layer), which main parts are close to the corresponding electrode pads, radiate inward from the corresponding electrode pads and around the deformation center on the substrate. However, in this pattern formation technology, the wiring patterns radiate from the center of a package mounting face. Accordingly, excessive stress may be applied to each of the led wiring portions (e.g., a copper foil portion on the boundary between the pad and the leader line) due to elastic deformation of the wiring board when subjected to heat stress as described above, and is highly liable to cause contact failure, disconnection, etc., of the wiring portion.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, there is provided a printed circuit board including a plurality of electrode pads provided on a component mounting face on which a semiconductor component is to be mounted, a plurality of hole terminals provided on the component mounting face so as to correspond to the electrode pads, and a plurality of wiring pattern layers connecting the plurality of electrode pads and the plurality of hole terminals corresponding to the plurality of electrode pads, the plurality of wiring pattern layers being wired across directions of elastic deformation of the component mounting face.

Figure 1:
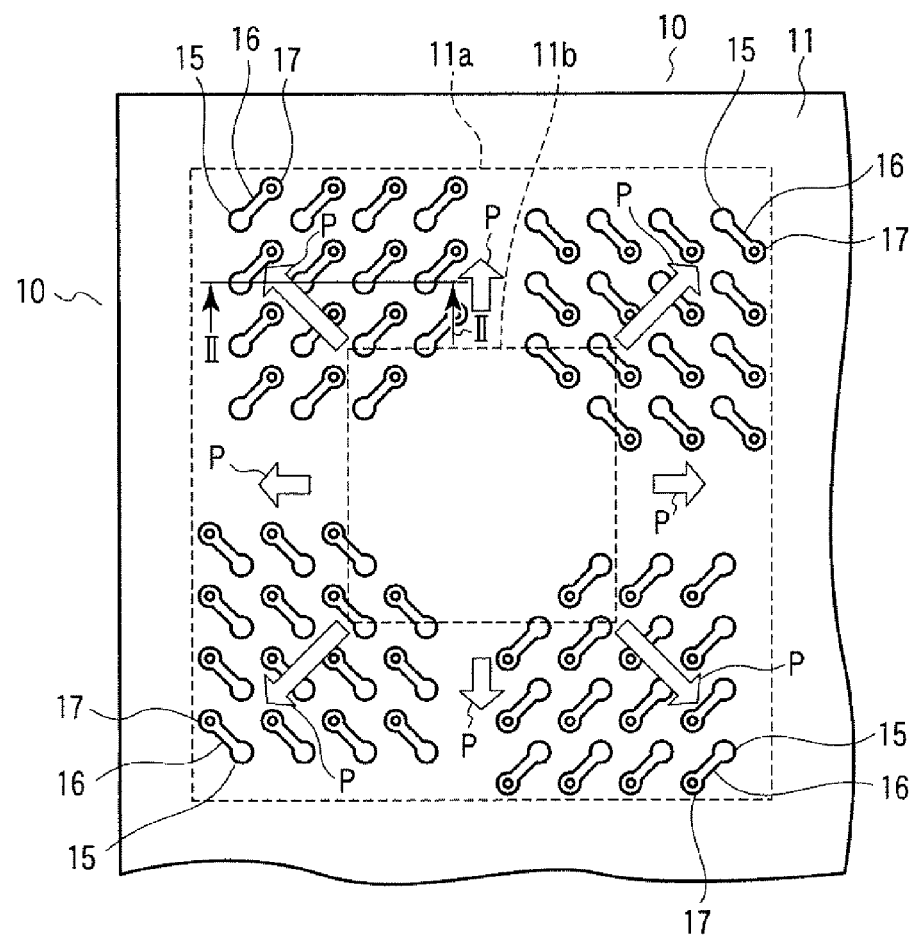
FIG. 1 is an exemplary plan view of the configuration of the main part of a printed circuit board according to a first embodiment of the invention.

FIG. 1 is a plan view of the configuration of the main part of a printed circuit board according to the first embodiment of the invention, on which a semiconductor component is to be mounted.

As shown in FIG. 1, a printed circuit board 10 according to the first embodiment of the invention has a semiconductor component mounting part 11a (i.e., an area where a semiconductor component is to be mounted) on a component mounting face 11 that is the surface layer of the wiring board 10. Provided on the semiconductor component mounting part 11a are: a plurality of electrode pads 15; a plurality of hole terminals 17 corresponding to the electrode pads 15; and a plurality of wiring pattern layers (i.e., leader lines) 16 connecting the electrode pads 15 and the corresponding hole terminals 17 in circuit. These wiring pattern layers 16 are wired across the directions of elastic deformation (i.e., directions of thermal expansion) of the semiconductor component mounting part 11a of the component mounting face of the wiring board, which thermally expands due to heat generated during operation of a semiconductor component mounted on the semiconductor component mounting part 11a. The directions of elastic deformation (the directions of thermal expansion) are indicated by arrows P in FIG. 1.

The directions of thermal expansion, indicated by the arrows P, radiate outward from the mounted position 11b of the semiconductor chip (i.e., silicon chip). The wiring pattern layers 16 are wired across the direction of the radials.

In the first embodiment shown in FIG. 1, the wiring pattern layers 16 are arranged in four rectangular areas into which the quadrangular semiconductor component mounting part 11a is sectioned around the center of the mounting part 11a. From the center of the mounted position 11b of the semiconductor chip, these wiring pattern layers 16 are oriented in wiring directions across the directions toward the corners (i.e., angles) of the semiconductor component mounting part 11a.

The printed circuit board 10 includes at least one semiconductor component mounting part 11a that has, as mentioned above, the electrode pads 15, wiring pattern layers 16, and hole terminals 17 on the component mounting face 11, which is the surface layer. For example, a printed circuit board 10 for a CPU board includes a small number (e.g., one to four or so) of semiconductor component mounting parts 11a; and that for a large capacity solid storage device (i.e., solid-state drive) includes many (e.g., six to eight or so) semiconductor component mounting parts 11a.

Mounted on each of these semiconductor component mounting parts 11a is a semiconductor package of an area array type. Examples of such a semiconductor package are a ball grid array (BGA), a chip size package (CSP) and an land grid array (LGA), which have external joining electrodes (solder terminals) formed on their undersides. In the first embodiment, a BGA (i.e., semiconductor package) having semiconductor balls on the underside of a substrate is mounted on the semiconductor component mounting part 11a.

The electrode pads 15 are conductively joined to the corresponding solder balls formed on the underside of the substrate of the BGA mounted on the semiconductor component mounting part 11a.

Each of the hole terminals 17 is a relay terminal for conductively connecting the electrode pad 15 to the internal pattern layer of the printed circuit board 10 via the wiring pattern layer 16. The hole terminal 17 is a through-hole or via-hole (e.g., blind via-hole) having a pad. In the first embodiment, a through-hole is used as an example of the hole terminal 17.

Figure 2:
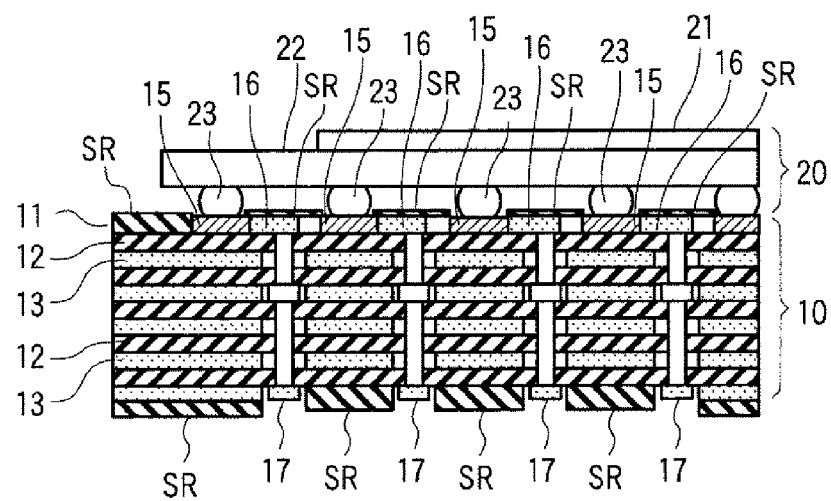
FIG. 2 is an exemplary vertical section of the configuration of the main part of the printed circuit board according to the first embodiment, taken along the line II-II shown in FIG. 1.

FIG. 2 shows a BGA mounted on the semiconductor component mounting part 11a of the printed circuit board 10 described above. FIG. 2 exemplifies the configuration (partly omitted) of a vertical section, taken along the line II-II shown in FIG. 1.

As shown in FIG. 2, the printed circuit board 10 according to the first embodiment has a multi-layer structure in which a plurality of insulation layers 12 and a plurality of wiring layers 13 are alternated. The component mounting face 11, which is a surface layer, has the semiconductor component mounting part 11a on which the BGA 20 is to be mounted.

The BGA 20 includes a semiconductor chip (silicon chip) 21, a substrate 22, and a plurality of solder balls 23. The silicon chip 21 is mounted on the upper face of the substrate 22, and the solder balls 23 are provided on the underside of the substrate. The solder balls 23 on the underside of the substrate 22 of the BGA 20 are soldered and joined to the electrode pad 15 of the semiconductor component mounting part 11a and thereby the BGA 20 is mounted on the semiconductor component mounting part 11a. The mounted position of the silicon chip 21 of the BGA 20 mounted on the semiconductor component mounting part 11a is indicated by reference numeral 11b in FIG. 1.

Formed on the component mounting face 11 of the printed circuit board 10 is an insulation film, such as a solder resist film (SR), which prevents exposure of a conductor pattern layer (i.e., copper foil pattern layer) formed on the surface layer. The solder resist film (SR) is formed on the semiconductor component mounting part 11a except for areas of the electrode pads 15 and areas around the electrode pads 15. The solder resist film formation prevents solder from flowing into the areas around the electrode pads 15.

As shown in FIG. 1, the semiconductor component mounting part 11a of the printed circuit board 10 has the electrode pads 15, the hole terminals 17 corresponding to the electrode pads 15, and the wiring pattern layers (i.e., leader lines) 16 connecting the electrode pads 15 and hole terminals 17 in circuit.

Figure 3:
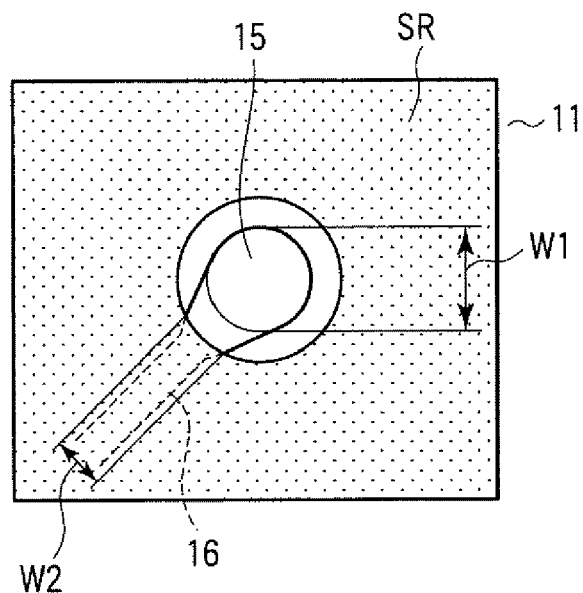
FIG. 3 is an exemplary plan view of an example of the configuration of the leader portion of each of wiring pattern layers on the printed circuit board according to the first embodiment.
Figure 4:
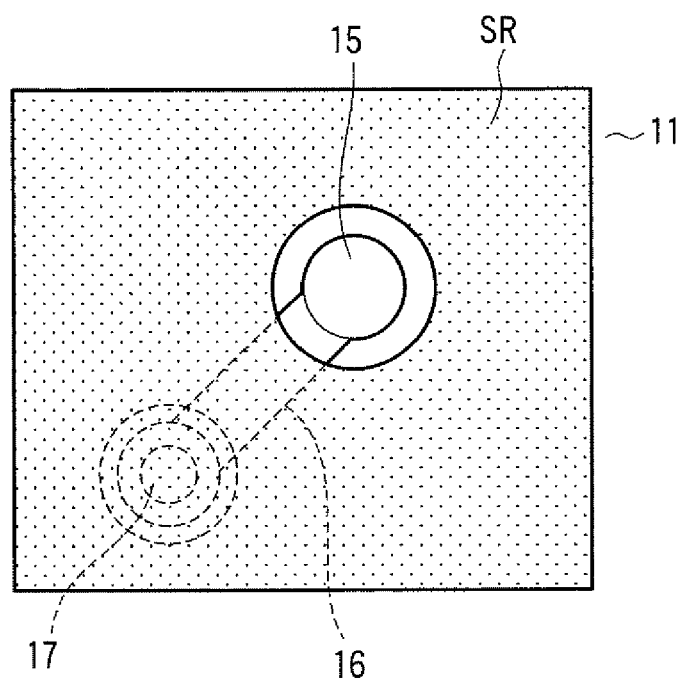
FIG. 4 is an exemplary plan view of another example of the configuration of the leader portion of each of the wiring pattern layers on the printed circuit board according to the first embodiment.

Each of the wiring pattern layers 16 connecting the electrode pad 15 has a boundary of the solder resist film (SR) and an exposed potion exposed from the solder resist film (SR). The width of the exposed potion of the wiring pattern layer 16 is equal to or greater than a half of the diameter W1 of the electrode pad 15. FIG. 3 shows an example of the shape of the connecting portion of the wiring pattern layer 16 with the electrode pad 15. FIG. 4 shows another example of the shape of the connecting portion.

The example (shown in FIG. 3) of the shape of the connecting portion of the wiring pattern layer 16 with the electrode pad 15 gradually narrows toward the boundary of the solder resist film (SR) from the electrode pad 15 so that the pattern width, i.e. line width W2 of the wiring pattern layer 16 in the boundary of the solder resist film (SR) is equal to or greater than half the diameter W1 of the electrode pad 15.

In the example (shown in FIG. 4) of the shape of the connecting portion of the electrode pad 15 with the wiring pattern 16, the wiring pattern layer 16 extending to the hole terminal 17 has a constant Line width equal to or greater than half the diameter (see W1 in FIG. 3) of the electrode pad 15.

The foregoing printed circuit board structure according to the first embodiment of the invention prevents the led wiring portion of each wiring pattern layer 16 from being subjected to excessive stress exerted by elastic deformation (i.e., thermal expansion) of the wiring board face, which results from heat stress as mentioned above. This avoids trouble such as contact failure or disconnection of the wiring parts and accordingly maintains highly reliable, stable circuit wiring in the face of such heat stress.

Specifically, compared to the shape of the board surface of the printed circuit board 10 and the pattern on the board 10, the substrate 22 of the BGA 20 is formed from highly precise leader lines and an extremely thin insulation material. Such a difference in structure results in a difference in the coefficient of thermal expansion. In addition, the substrate 22 of the BGA 20 incorporates the silicon chip 21, which is a main active semiconductor forming, for example, an information processing device; therefore, the quantity of heat generated during its operation is large, and thermal expansion is great. Thus, the coefficient of thermal expansion of the substrate 22 of the BGA 20 is different from that of the printed circuit board 10 on which the BGA 20 is mounted.

The directions of elastic deformation (i.e., the directions of thermal expansion) of the semiconductor component mounting part 11a on the wiring board face when subjected to thermal expansion are indicated by the arrows P in FIG. 1.

Heat generated in the silicon chip 21 during the operation of the BGA 20 is transmitted, in the following order, to: the substrate 22; the solder balls 23; and the electrode pads 15, through-holes 17, and internal layer of the printed circuit board 10.

Expansion power, produced when the silicon chip 21 expands due to heat generated in the silicon chip 21, is transmitted, in the following order, to: the substrate 22; the solder balls 23; and the electrode pads 15, wiring pattern layers 16, and through-holes 17 of the printed circuit board 10.

If the leading direction of each wiring pattern layer 16 coincides with (or is parallel with) the direction P of elastic deformation, which is the direction of expansion of the silicon chip 21, expanding or contracting forces in the wiring direction act greatest on the wiring pattern layer 16 between the electrode pad 15 and through-hole 17. Consequently, the wiring pattern layer 16 expands or contacts in the wiring direction, which frequently results in disconnection.

Additionally, as shown in FIG. 3, each of the wiring pattern layers 16 has a boundary of solder resist film (SR). The boundary is highly susceptible to expansion stress, which may lead to disconnection of the wire led from the electrode pad 15 of the wiring pattern layer 16.

To avoid such a concentration of minute stress, it is important to dissipate force exerted from the main direction of expansion (i.e., the directions P of elastic deformation). This stress can be reduced by wiring each of the wiring pattern layers 16 perpendicularly to the direction of thermal expansion (i.e., the direction of elastic deformation) of the substrate 22.

As described above, the printed circuit board 10 according to the first embodiment of the invention can avoid such a trouble as disconnection because the wiring pattern layers 16 connecting the corresponding electrode pads 15 and the corresponding hole terminals 17 are wired across the directions P of elastic deformation caused by thermal expansion of the silicon chip 21 of the BGA 20 mounted on the semiconductor component mounting part 11a. In other words, problems such as disconnection can be avoided since the wiring pattern layers 16 are wired across the radial directions extending around the mounted position 11b of the silicon chip 21 of the BGA 20 provided on the semiconductor component mounting part 11a.

Additionally, as shown in FIG. 3, the shape of the connecting portion of the wiring pattern layer 16 with the electrode pad 15 gradually narrows toward the boundary of the solder resist film (SR) from the electrode pad 15 so that the pattern width, i.e. line width W2 of the wiring pattern layer 16 in the boundary of the solder resist film (SR) is equal to or greater than half the diameter W1 of the electrode pad 15. Thus, such problems as disconnection or connection failure of the led portion of the wiring pattern layer 16 from the electrode pad 15 can be prevented without increasing the line width of the wiring pattern layer 16.

Further, the wiring directions of the wiring pattern layers 16 are not parallel to the directions P of elastic deformation caused by thermal expansion of the silicon chip 21. Accordingly, even if the wiring board, for example, warps or bends due to heat stress (as described above) or external stress, their adverse effects on the wiring board can be minimized.

Figure 5:
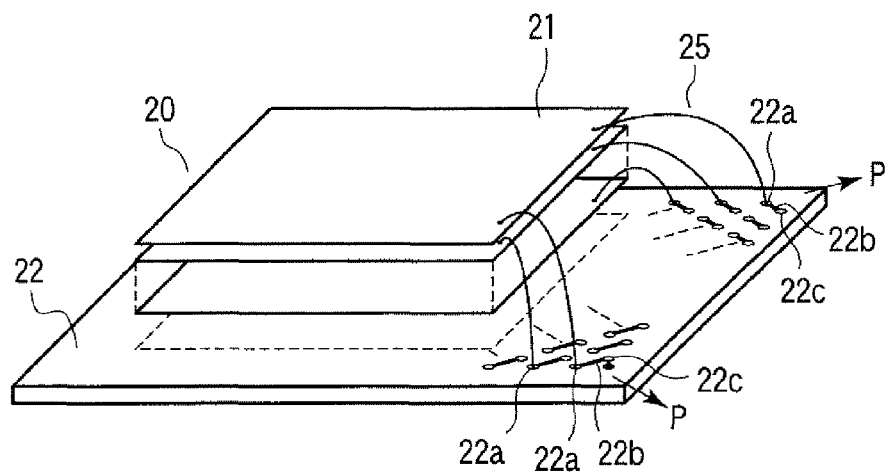
FIG. 5 is an exemplary perspective view of an example of the configuration of a semiconductor component mounted on the semiconductor component mounting part of the printed circuit board according to the first embodiment.

FIG. 5 shows an example of the configuration of the BGA 20 mounted on the semiconductor component mounting part 11a of the printed circuit board 10 described above.

The BGA 20 shown in FIG. 5 includes: a plurality of silicon chips 21 provided in layers; and a substrate 22 on which the silicon chips 21 are mounted. This BGA 20 comprises, for example, a packaged memory. The substrate 22 is formed of a multiplayer printed circuit board as in the printed circuit board 10, and is made smaller than the printed circuit board 10 by micro-processing.

Formed on the upper face of the substrate 22 with the silicon chips 2 mounted thereon is a circuit pattern using the pattern forming technology as shown in FIG. 1.

Around the silicon chip mounting area of the upper face (i.e., surface layer) of the substrate 22 with the silicon chips 21 mounted thereon are: a plurality of electrode pads 22a connected to the silicon chips 21 by bonding wires 25; a plurality of hole terminals (e.g., through-holes) 22b corresponding to the electrode pads 22a; and a plurality of wiring pattern layers (i.e., leader lines) 22c connecting the electrode pads 22a and the corresponding through-holes 22b in circuit. As shown in FIG. 1, these wiring pattern layers 22c are also wired across the directions P of elastic deformation caused by thermal expansion of the silicon chips 21.

Thus, like the printed circuit board 10, the substrate 22 is rendered less susceptible to the stress of contraction or expansion of the wiring board face when subjected to thermal expansion in the wiring directions of the wiring pattern layers 22c.

Figure 6:
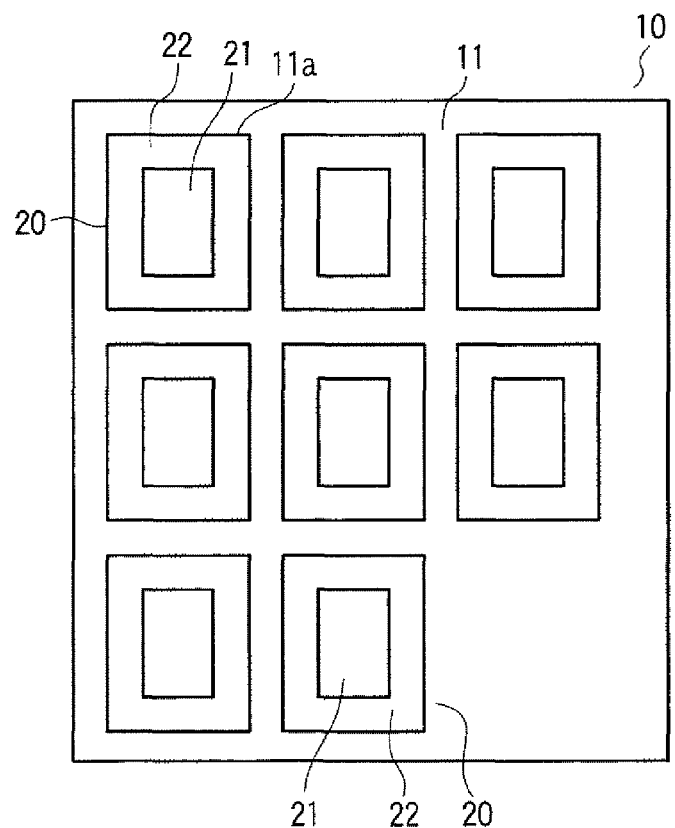
FIG. 6 is an exemplary plan view of an example of the configuration of a solid-state drive using the printed circuit board according to the first embodiment.

FIG. 6 shows an example of a configuration in which a plurality of BGAs 20 shown in FIG. 5 are mounted on the printed circuit board 10, thereby forming a solid-state drive (SSD). In this case, the printed circuit board 10 is divided into eight sections, which serve as semiconductor component mounting parts 11a. The BGA 20 shown in FIG. 5 is mounted on each of the semiconductor component mounting parts 11a, thereby forming on the printed circuit board 10 a solid-state drive (SSD) of large capacity, which can be substituted for a hard disk device. In this solid-state drive (SSD), each substrate (i.e., circuit board) on which the BGA 20 is mounted is realized by the printed circuit board 10 shown in FIG. 1. This renders the wiring pattern layers less susceptible to stress caused by thermal expansion of the silicon chips 21 mounted on the BGA 20. Thus, highly reliable, stable operation of the memory is assured.

Figure 7:
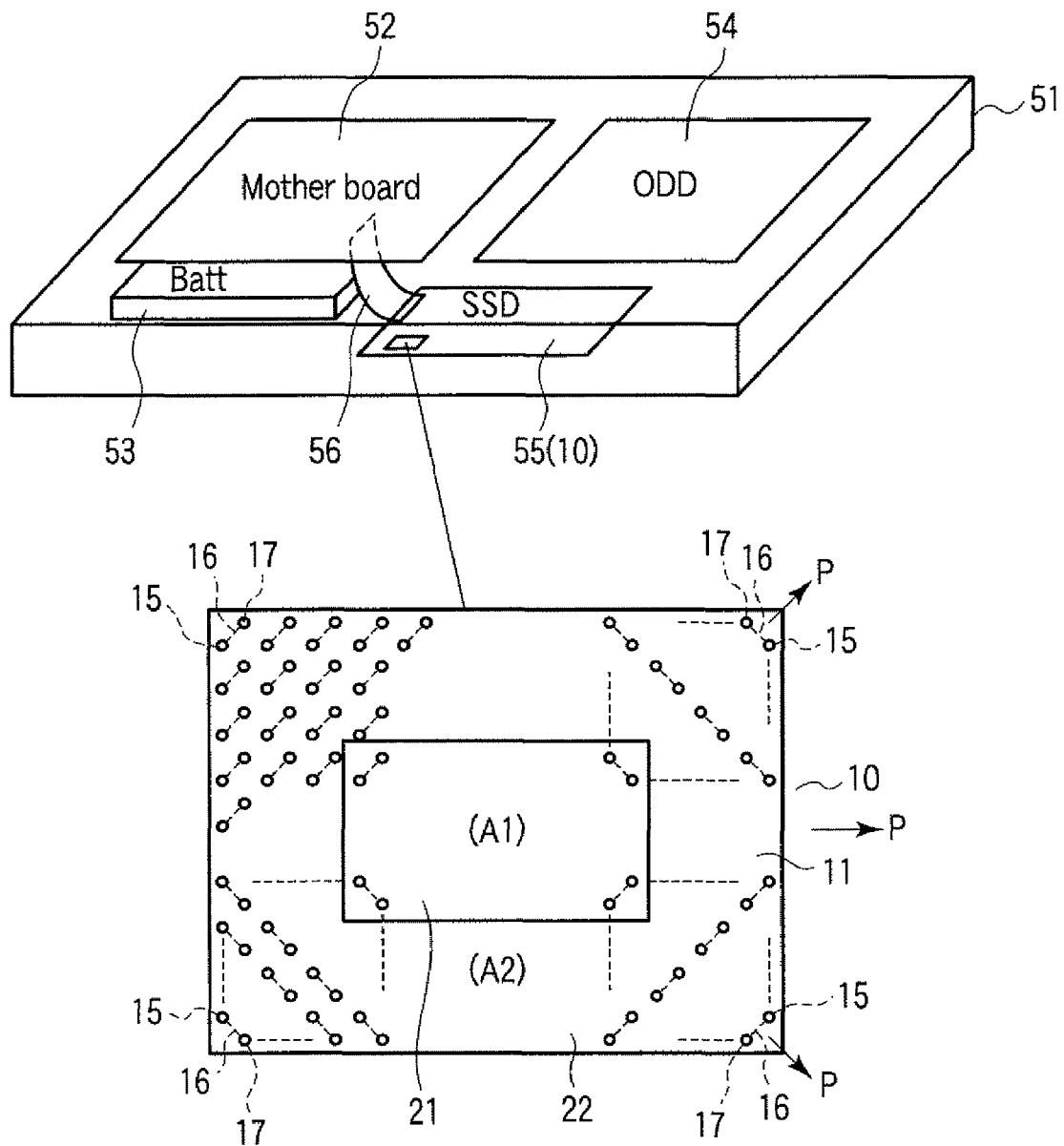
FIG. 7 shows an exemplary configuration of the main part of an electronic device according to a second embodiment of the invention.

FIG. 7 shows the configuration of an electronic device according to a second embodiment of the invention. Having the solid-state drive (SSD) in FIG. 6 as a component element, the electronic device shown FIG. 7 realizes a compact information processor that is easy to carry. Mounted on a body 51 of the information processor shown in FIG. 7 are a mother board 52, a battery (Batt) 53, an optical magnetic disk drive (ODD) 54, a solid-state drive (SSD) 55, etc. The solid-state drive (SSD) 55 is connected to the mother board 52 via a flexible printed circuit board 56. Input and output devices, such as a keyboard and display, are also mounted on the body 51. However, these input and output devices are not shown in FIG. 7.

The mother board 52 has a CPU and a peripheral circuit for the CPU, and forms a control circuit that follows instructions given from the input and output devices (not shown) and controls the read/write access of the optical magnetic disk drive 54 and solid-state drive 55. While controlled by the control circuit, the solid-state drive (SSD) 55 functions as a large-capacity solid storage device for storing various application programs, multimedia information including images and sound, text data, etc.

The solid-state drive (SSD) 55 is formed by mounting the BGA 20 (shown in FIG. 5) onto each of the semiconductor component mounting parts 11a of the printed circuit board 10 (shown in FIG. 6). The printed circuit board 10, which is a component element of the solid-state drive (SSD) 55, has a wiring structure in which a plurality of wiring pattern layers (i.e., leader lines) 16 connecting a plurality of electrode pads 15 and a plurality of hole terminals 17 corresponding to the electrode pads 15 on each of semiconductor component mounting parts 11a are wired across the directions of elastic deformation (i.e., the directions of thermal expansion) of the wiring board face when subjected to thermal expansion due to heat generated by the silicon chips 21 of the BGA 20 mounted on each semiconductor component mounting part 11a. Accordingly, the printed circuit board 10 is less susceptible to stress from thermal expansion of the silicon chips 21 mounted on the BGA 20. This makes it possible to reduce disconnection and connection failure caused by the stress in the wiring connecting the silicon chips 21 to the printed circuit board 10, and to maintain long-lasting, highly reliable and stable operation of the memory.

Thus, the foregoing embodiments of the invention can maintain highly reliable, stable operation of the circuit in the face of wiring board stress from thermal expansion, etc., of a semiconductor component mounted on the component mounting face.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A printed circuit board comprising:
   a plurality of electrode pads on a quadrangular component mounting face on which a semiconductor component is to be mounted;
   a plurality of hole terminals on the component mounting face so as to correspond to the electrode pads; and
   a plurality of wiring patterns connecting the plurality of electrode pads and the plurality of hole terminals corresponding to the plurality of electrode pads, the plurality of wiring patterns wired in directions across directions proceeding from a center of the component mounting face toward corners of the component mounting face, in respective areas into which the component mounting face is sectioned by borderlines connecting a central portion of the component mounting face and middle portions of sidelines of the component mounting face,
   wherein an insulation film is on the component mounting face except for areas of the plurality of electrode pads and areas around the plurality of electrode pads, and
   wherein each of the plurality of wiring patterns has a boundary of the insulation film and an exposed portion exposed from the insulation film, the exposed portion being equal to or greater than a half of a diameter of one of the plurality of electrode pads.

2. The printed circuit board of claim 1, wherein the plurality of wiring patterns are wired in directions across directions of elastic deformation caused by thermal expansion extending around a mounted position of a semiconductor chip included in the semiconductor component on the component mounting face.

3. The printed circuit board of claim 1, wherein the plurality of wiring patterns are arranged with predetermined distances in line-column directions.

4. An electronic device comprising:
   a circuit board on which a semiconductor package is mounted; and
   a body containing the circuit board, the circuit board comprising:
      a plurality of electrode pads on a quadrangular component mounting face of the semiconductor package,
      a plurality of hole terminals on the component mounting face so as to correspond to the plurality of electrode pads, and
      a plurality of wiring patterns connecting the plurality of electrode pads and the plurality of hole terminals corresponding to the plurality of electrode pads, the plurality of wiring patterns wired in directions across directions proceeding from a center of the component mounting face toward corners of the component mounting face, in respective areas into which the component mounting face is sectioned by borderlines connecting a central portion of the component mounting face and middle portions of sidelines of the component mounting face,
         wherein an insulation film is on the component mounting face except for areas of the plurality of electrode pads and areas around the plurality of electrode pads, and
         wherein each of the plurality of wiring patterns has a boundary of the insulation film and an exposed portion exposed from the insulation film, the exposed portion being equal to or greater than a half of a diameter of one of the plurality of electrode pads.

5. A printed circuit board comprising:
   a plurality of electrode pads on a quadrangular component mounting face on which a semiconductor component is to be mounted;
   a plurality of hole terminals on the component mounting face so as to correspond to the electrode pads; and
   a plurality of wiring patterns connecting the plurality of electrode pads and the plurality of hole terminals corresponding to the plurality of electrode pads, the plurality of wiring patterns wired in directions perpendicular to directions proceeding from a center of the component mounting face toward corners of the component mounting face, in respective areas into which the component mounting face is sectioned by borderlines connecting a central portion of the component mounting face and middle portions of sidelines of the component mounting face,
      wherein an insulation film is on the component mounting face except for areas of the plurality of electrode pads and areas around the plurality of electrode pads, and
      wherein each of the plurality of wiring patterns has a boundary of the insulation film and an exposed portion exposed from the insulation film, the exposed portion being equal to or greater than a half of a diameter of one of the plurality of electrode pads.

6. The printed circuit board of claim 5, wherein the plurality of wiring patterns are wired in directions across directions of elastic deformation caused by thermal expansion extending around a mounted position of a semiconductor chip included in the semiconductor component on the component mounting face.

7. The printed circuit board of claim 5, wherein the plurality of wiring patterns are arranged with predetermined distances in line-column directions.

\* \* \* \* \*